United States Patent
Mao et al.

(10) Patent No.: US 11,640,947 B2
(45) Date of Patent: May 2, 2023

(54) PRE-RESIST ISLAND FORMING VIA METHOD AND APPARATUS

(71) Applicant: NXP B.V., Eindhoven (NL)

(72) Inventors: Kuan-Hsiang Mao, Kaohsiung (TW); Wen Hung Huang, Kaohsiung (TW); Che Ming Fang, Kaohsiung (TW); Yufu Liu, Kaohsiung (TW)

(73) Assignee: NXP B.V., Eindhoven (NL)

( * ) Notice: Subject to any disclaimer, the term of this patent is extended or adjusted under 35 U.S.C. 154(b) by 29 days.

(21) Appl. No.: 17/333,837

(22) Filed: May 28, 2021

(65) Prior Publication Data
US 2022/0384372 A1   Dec. 1, 2022

(51) Int. Cl.
| | | |
|---|---|---|
| *H01L 23/00* | (2006.01) | |
| *C09D 5/24* | (2006.01) | |
| *C09D 179/04* | (2006.01) | |
| *C09D 179/08* | (2006.01) | |
| *G03F 7/09* | (2006.01) | |

(52) U.S. Cl.
CPC ............. *H01L 24/03* (2013.01); *C09D 5/24* (2013.01); *C09D 179/04* (2013.01); *C09D 179/08* (2013.01); *H01L 24/02* (2013.01); *H01L 24/05* (2013.01); *H01L 24/13* (2013.01); *G03F 7/09* (2013.01); *H01L 2224/02311* (2013.01); *H01L 2224/02331* (2013.01); *H01L 2224/0345* (2013.01); *H01L 2224/0362* (2013.01); *H01L 2224/03462* (2013.01);
(Continued)

(58) Field of Classification Search
CPC ................... H01L 24/03; H01L 24/13; H01L 2224/02331
See application file for complete search history.

(56) References Cited

U.S. PATENT DOCUMENTS

| | | | | |
|---|---|---|---|---|
| 5,955,244 A | * | 9/1999 | Duval | ............... G03F 7/09 430/319 |
| 7,265,341 B2 | | 9/2007 | Sivakumar | |
| | | (Continued) | | |

FOREIGN PATENT DOCUMENTS

| | | |
|---|---|---|
| WO | 2008067237 A1 | 6/2008 |
| WO | 2020067732 A1 | 4/2020 |

OTHER PUBLICATIONS

Michael Töpper et al., Ultra-Small Via-Technology of Thinfilm Polymers Using Advanced Scanning Laser Ablation, SUSS MicroTec, 2015.

*Primary Examiner* — Dale E Page
*Assistant Examiner* — Wilner Jean Baptiste

(57) ABSTRACT

A packaging semiconductor device, such as a fan-out Wafer-Level Packaging (FOWLP) device, is fabricated by providing a semiconductor device (20) having conductive patterns (22) disposed on a first surface and then forming, on the conductive patterns, photoresist islands (24) having a first predetermined shape defined by a first critical width dimension and a minimum height dimension so that a subsequently-formed dielectric polymer layer (26) surrounds but does not cover each photoresist island (24), thereby allowing each photoresist island to be selectively removed from the one or more conductive patterns to form one or more via openings (28) in the dielectric polymer layer such that each via opening has a second predetermined shape which matches at least part of the first predetermined shape of the photoresist islands.

18 Claims, 5 Drawing Sheets

(52) U.S. Cl.
CPC ............... *H01L 2224/0401* (2013.01); *H01L 2224/05024* (2013.01); *H01L 2224/13026* (2013.01)

(56) References Cited

U.S. PATENT DOCUMENTS

| | | |
|---|---|---|
| 7,265,431 B2 | 9/2007 | Sivakumar |
| 9,679,804 B1 | 6/2017 | Chen et al. |
| 2011/0193202 A1 | 8/2011 | Yu et al. |

\* cited by examiner

PRE-RESIST ISLAND FORMING VIA METHOD AND APPARATUS

BACKGROUND OF THE INVENTION

Field of the Invention

The present invention is directed in general to the field of semiconductor devices. In one aspect, the present invention relates to electronic component packaging.

Description of the Related Art

As electronics technology develops, an increasing number of electrical connections must be squeezed into an increasingly smaller package size with reduced costs in order to meet market expectations. As a result, semiconductor device manufacturers continue working to reduce the cost of packaged devices while increasing circuit density, there are technical challenges with increasing the number of interconnections due to fabrication processing constraints. One approach for achieving increased interconnection density is to use wafer-level packaging (WLP) wherein fabricated integrated circuits are packaged while still part of the wafer and then subsequently diced so that each packaged die (with outer layers of packaging already attached) is practically of the same size as the die itself. However, the smaller packaged die size limits the number of external contacts that can be accommodated in the smaller package footprint, an increasingly significant limitation as complex semiconductor devices increasingly require a large number of contacts. To accommodate more interconnections without increasing the die size, bumping technologies are increasingly used with packaging technologies, such as wafer-level fan-out packaging. For example, a fan-out WLP process may place singulated wafer dies on a carrier wafer or panel which includes a space for fan-out kept around each die, and then after reconstituting singulated die on a molded carrier body, one or more redistribution layers (RDLs) are added over the entire molded area (e.g., both atop the chip and atop the adjacent fan-out area) and solder balls or bumps are formed on top of the RDLs, thereby forming interconnections than can be accommodated by the individual die size. While existing WLP approaches can provide interconnects between die pads with <50 um pitch and solder balls with ~0.5 mm pitch, there are processing costs and design constraints which constrain the ability of existing bumping technology solutions to achieve finer pitches while meeting the applicable performance, design, complexity and cost constraints for packing integrated circuit devices.

BRIEF DESCRIPTION OF THE DRAWINGS

The present invention may be understood, and its numerous objects, features and advantages obtained, when the following detailed description of a preferred embodiment is considered in conjunction with the following drawings.

Figure 1:
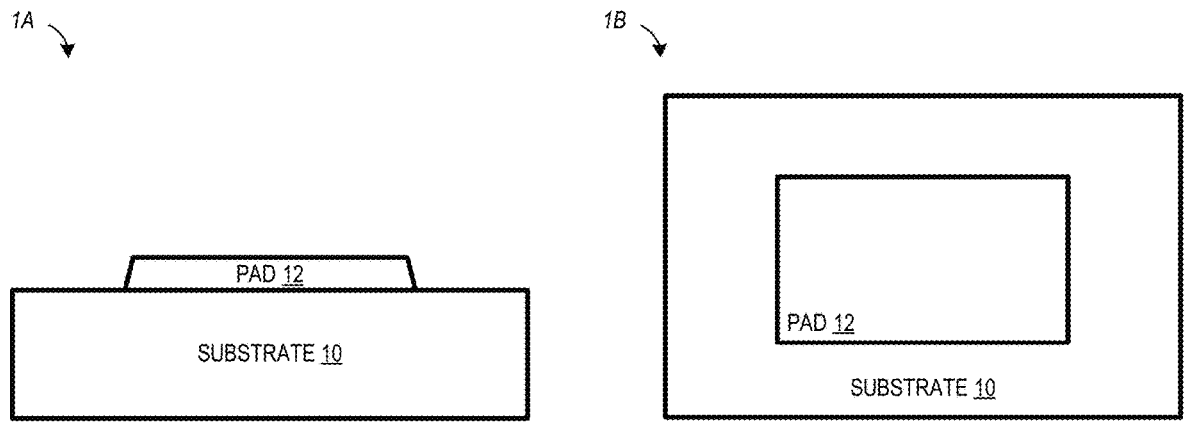
FIG. 1 illustrates cross section and plan views of an integrated circuit substrate and die pad prior to fabrication of a carrier wafer or panel.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for fabricating extremely small via openings in carrier substrate layers formed on an integrated circuit die by forming photoresist islands on intended contact areas (e.g., die pads or redistribution lines), depositing one or more dielectric packaging layers over the integrated circuit die to surround the photoresist islands, and then removing the photoresist islands, thereby defining via openings in the dielectric packaging layer(s) which expose the intended contact areas. By varying the photoresist lithography process (e.g., using positive or negative tone type) used to form the photoresist islands, the shape of the photoresist islands can be adjusted, thereby controlling the sidewall profile of the via openings formed in the dielectric packaging layers after removal of the photoresist islands. In selected embodiments, the sizing of the via openings across a package surface and levels may be selectively varied by controlling the size of the corresponding photoresist islands. By using photoresist lithography techniques to construct photoresist islands that are designed to have the same size as the targeted via openings, extremely small via openings having width dimensions below 5 um can be fabricated, thereby allowing reduction in pitch spacing, improvements in via resolution, and increases in interconnection densities. In addition to achieving finer via resolution (e.g., <5 um) than is possible with conventional photolithography techniques for etching via openings in dielectric packaging layers (e.g., 10-15 um), another advantage of the disclosed photoresist island technique is to avoid the complicated process window tuning requirements for coating, exposing, and developing dielectric polymer layers (e.g., coating thickness, exposure method/dosage, post exposure bake (PEB)/post develop bake (PDB), develop recipe, curing profile, post cure de-scum, etc.) that must be controlled with conventional photolithography techniques for etching via openings in dielectric packaging layers. As will be appreciated, the disclosed photoresist island technique for fabricating via openings is generally applicable to semiconductor device fabrication in front end processing (e.g., wafer fab circuit layout), middle end processing (e.g., wafer level packaging), and/or back end processing (e.g., package assembly).

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a packaged integrated circuit device which are not drawn to scale and which do not include every device feature or geometry in order to avoid limiting or obscuring the present invention. It is also noted that, throughout this detailed description, certain materials (such as dielectric polymer layers and/or redistribution layers) will be formed and selectively removed to fabricate the packaged IC device. Where the specific procedures for forming or removing such materials are not detailed below, conventional techniques to one skilled in the art for depositing, masking, etching, removing or otherwise forming such layers at appropriate thicknesses and dimensions may be used. Such details are well known and not considered necessary to teach one skilled in the art of how to make or use the present invention.

Turning now to FIG. 1, there is illustrated an initial step in a conventional packaging sequence with a cross-section view 1A and plan view 1B of an integrated circuit substrate 10 and die pad 12 prior to fabrication of a carrier wafer or panel. While a single die pad 12 is shown, it will be appreciated that the integrated circuit substrate 10 may include multiple die pads (not shown). In addition, it will be appreciated that the die pad 12 may be formed on either side of the integrated circuit die, so that the substrate 10 may be a silicon substrate layer on a backside or frontside of the IC die, or may be a passivation layer or interconnect layer formed on a backside or frontside of the IC die.

Figure 2:
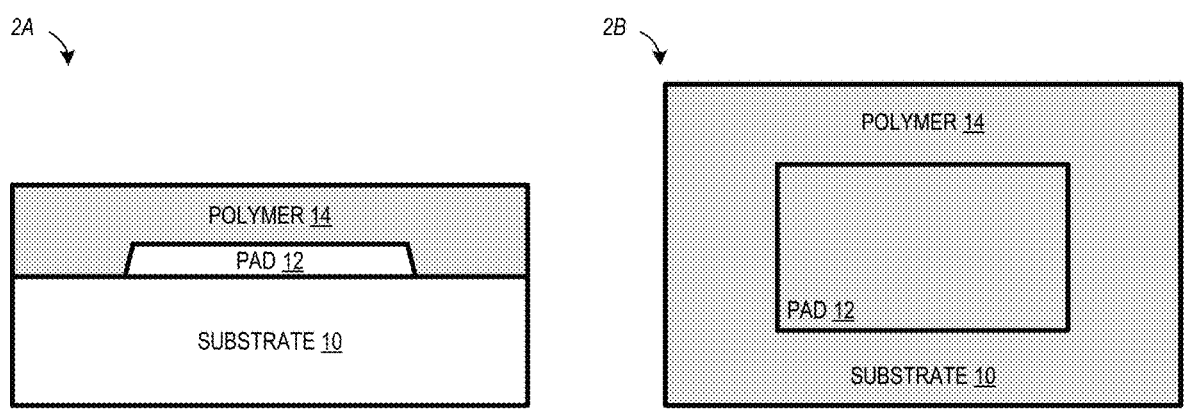
FIG. 2 illustrates processing subsequent to FIG. 1 after forming a dielectric polymer layer over the integrated circuit substrate and die pad.

Referring now to FIG. 2, there is illustrated a cross-section view 2A and plan view 2B of the semiconductor structure subsequent to FIG. 1 after forming a dielectric polymer layer 14 over the integrated circuit substrate 10 and die pad 12. With the conventional packaging sequence example, the dielectric polymer layer 14 may be formed with any suitable technique, such as by depositing a layer of polyimide and/or polybenzoxazoles (PBO) over the wafer to a predetermined thickness. For example, a spin coating technique may be used to coat the wafer with the dielectric polymer layer 14 to a uniform thickness which completely covers the die pad 12.

Figure 3:
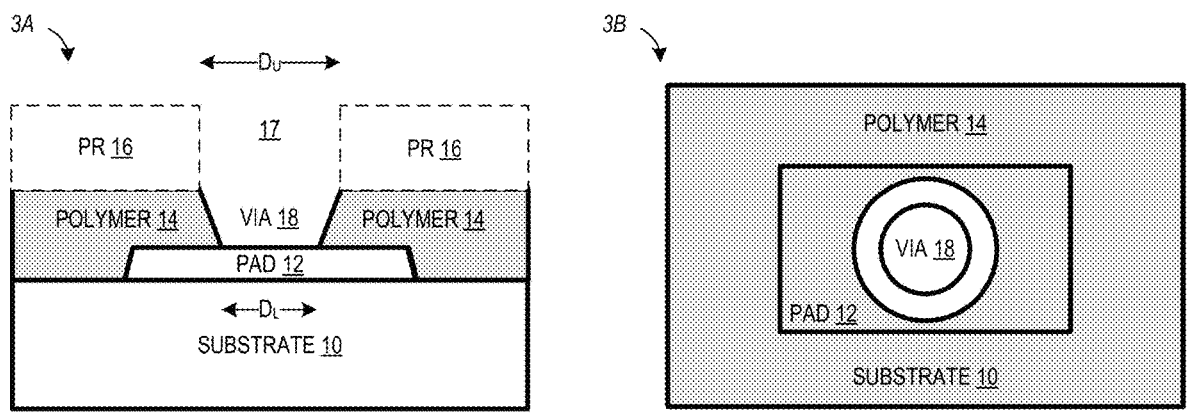
FIG. 3 illustrates processing subsequent to FIG. 2 after using photoresist lithography techniques to etch a via opening through a patterned photoresist etch mask to expose the die pad.

Referring now to FIG. 3, there is illustrated a cross-section view 3A and plan view 3B of the semiconductor structure subsequent to FIG. 2 after using conventional photoresist lithography techniques to etch a via opening 18 through a patterned photoresist etch mask 16 formed on the dielectric polymer layer 14 to expose the die pad 12. As will be appreciated, conventional photoresist lithography techniques may include depositing, patterning, etching or developing a photoresist or hard mask layer 16 over the semiconductor structure to cover the dielectric polymer layer 14 except for a resist opening 17, thereby forming a patterned photoresist mask 16-17. With the mask 16-17 in place, one or more etch processes may be applied to etch the dielectric polymer layer 14 that is exposed by the resist opening 17, thereby forming the via opening 18. The etch processing can include using the patterned photoresist mask 16-17 to perform a reactive-ion etching (RIE) step having a suitable etch chemistry properties to remove the exposed portions of the dielectric polymer layer 14.

Alternatively, the dielectric polymer layer 14 may be formed with a photosensitive photo-polymer layer 14 that is coated, baked, exposed, developed, cured, and cleaned to define the via opening 18 in the dielectric polymer layer 14. For example, after the coating the photo-polymer layer 14 on the wafer in a pre-cursor state, most of the solvent has to be removed from the coated polymer layer by heating the wafer with a process that can significantly influence the final results, so the heating process should be optimized for each polymer type. For example, if the temperature (or time) of the process is too high (or too long), the photo-sensitive components will be damaged, thereby limiting the resolution of the via opening 18. And if the temperature (or time) is too low (or too short), then the vias in the polymer will be not formed well, and may even lead to a dissolving effect in the later developing step. After applying a baking step, the photo-polymer layer 14 may be exposed to UV light using either mask aligner or steppers, and then developed to remove the portions of the photo-polymer layer 14 where the via openings 18 are formed. The developing step is also very sensitive to the duration of the process. Next, a polymerization curing process is applied to the photo-polymer layer 14 to give it mechanical properties for the later application, but this process can shrink the thickness of the photo-polymer layer 14, thereby affecting the via shape. In addition, some polymers require a descum process to remove any residues in the via to ensure a low electrical contact resistivity for the next metallization layer. In summary, the photo-process is a quite complex process which has multiple time- and temperature-sensitive process steps.

As will be understood by those skilled in the art, the via openings 18 formed with stepper exposure methods of conventional photoresist lithography techniques can achieve limited via resolution dimension of no better than 5-10 um aspect ratios. In addition to producing via with limited resolution, conventional via formation processes also suffer from additional processing steps and costs, such as requiring a polymer post-cure de-scum processes to address polymer residue concerns that can arise when forming the via openings 18. Another limitation from using conventional photoresist lithography techniques is that the post-cure sidewall profiles of the via openings 18 are not vertical, and can be adversely affected by numerous control parameters in the coating, exposure, develop and soft/hard baking steps. For example, the depicted via opening 18 is formed with a slanted sidewall having a wider upper width dimension $D_U$ and a smaller lower width dimension $D_L$. Such via sidewall profiles can impair the construction of conductive contacts in the via opening 18 by distorting the via stress distribution, seed layer sputtering coverage, plating deposition filling performance, and so on. The conventional technique for controlling the via sidewall profile in the via opening 18 requires a complex balancing of processing window of conventional method need to depends on a complicated process of tuning control parameters relating to the polymer coating material, thickness, exposure method/dosage, post exposure bake (PEB)/post develop bake (PDB), develop recipe, curing profile, post cure de-scum, etc.

Figure 4:
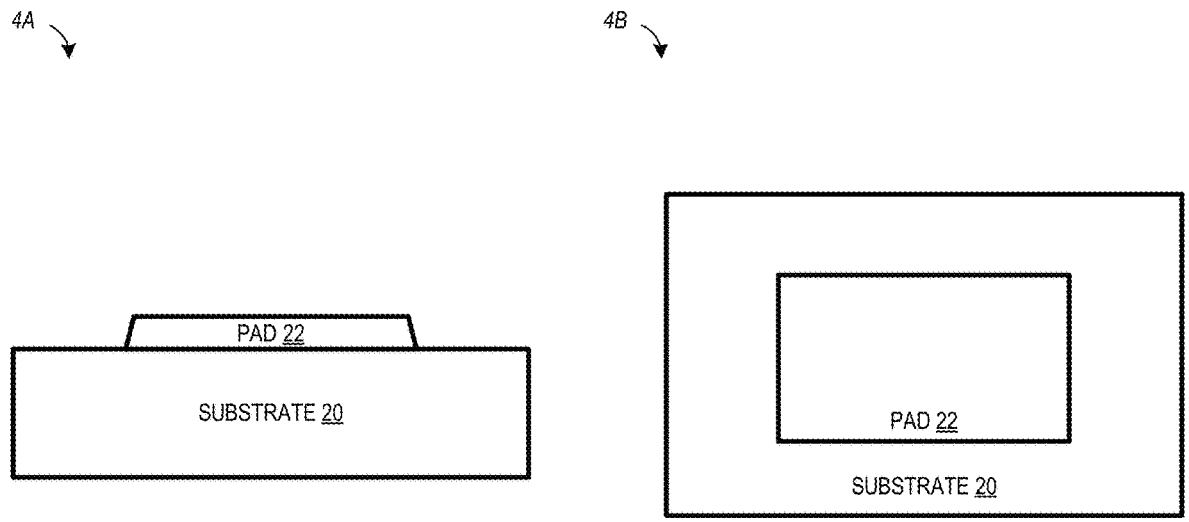
FIG. 4 illustrates cross section and plan views of an integrated circuit substrate and die pad prior to fabrication of a carrier wafer or panel in accordance with selected embodiments of the present disclosure.

To address these limitations and others associated with conventional packaging solutions, reference is now made to FIG. 4 which illustrates an initial step in a packaging sequence for fabricating extremely small via openings in carrier substrate layers formed on an integrated circuit die in accordance with selected embodiments of the present disclosure. As depicted with the cross-section view 4A and plan view 4B, an integrated circuit substrate 20 is provided with one or more die pads 22 prior to fabrication of a carrier wafer or panel. As disclosed herein, the die pad 22 may be formed on either side of the integrated circuit die, so that the substrate 20 may be a silicon substrate layer on a backside or frontside of the IC die, or may be a passivation layer or interconnect layer formed on a backside or frontside of the IC die. Though not shown, it will be appreciated that a patterned passivation layer may be formed over the substrate 20 and die pad 22 to leave an exposed contact region of the die pad 22 exposed.

Figure 5:
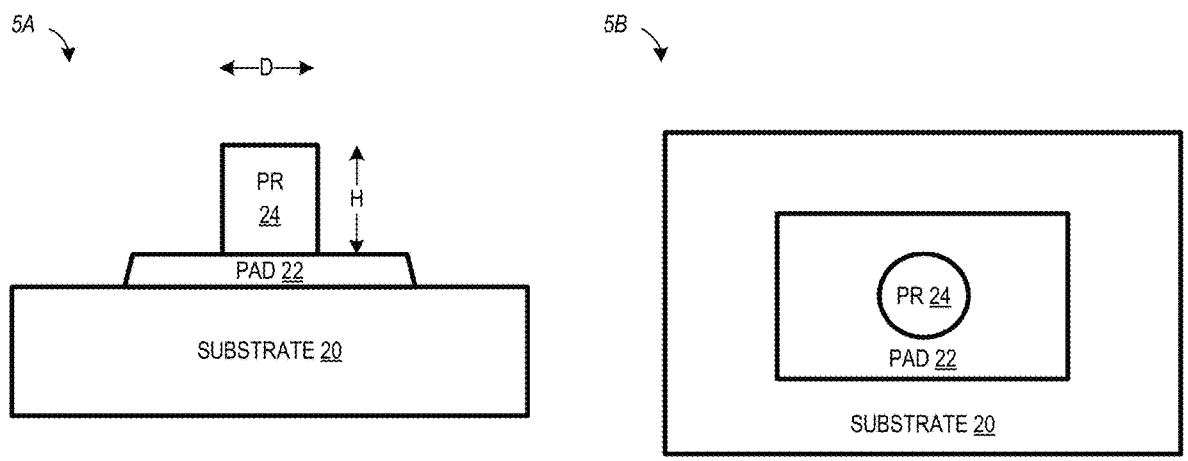
FIG. 5 illustrates processing subsequent to FIG. 4 after forming a patterned photoresist island on the die pad to a predetermined shape in accordance with selected embodiments of the present disclosure.

Referring now to FIG. 5, there is illustrated a cross-section view 5A and plan view 5B of the semiconductor structure subsequent to FIG. 4 after forming a patterned photoresist island 24 on the die pad 22 to a predetermined shape which may be defined by a width parameter D and height parameter H. As disclosed herein, the patterned photoresist island 24 may be formed with any suitable technique, such as by depositing or coating a photoresist layer that is then exposed and developed to form PR islands 24 in locations where the intended via openings will expose the underlying contact areas, such as the die pad 22. By using photoresist lithography techniques to construct the PR islands 24, the current photoresist patterning line space performance can be used to form PR islands at 4 um and smaller, thereby allowing reduction in pitch spacing, improvements in via resolution, and increases in interconnection densities. In selected embodiments, the photoresist lithography process used to form the PR islands 24 may be applied to form PR islands having substantially vertical sidewalls. In addition or in the alternative, the applied photoresist process may be varied (e.g., using positive or negative tone type) to adjust the shape of the PR islands 24, thereby controlling the sidewall profile without requiring control of the numerous control parameters required with conventional photoresist lithography techniques. As described hereinbelow, the width parameter D of the PR island 24 is controlled to provide the desired resolution of the intended via opening, while the height parameter H of the PR island 24 is controlled to extend or protrude above the subsequently formed dielectric polymer layer. Though the plan view 6B shows that the PR island 24 has a circular shape, the photoresist pattern process may be controlled to pattern the PR island 24 with any desired shape, including but not limited to a circle, octagon, rectangle, oval, etc.

In selected embodiments, the photoresist pattern process used to form the PR island 24 may use a negative tone photoresist, such as a dry film, having a minimum specified thickness that controlled to be thicker than the subsequently applied dielectric polymer coating, but thinner than the global industrial version. For example, the negative tone photoresist dry film used to form the PR island 24 may have a target thickness of 25-30 um. At this thickness, the dry film PR island 24 will have good adhesive properties with respect to the underlying die pad 22 (e.g., metal contact layers) during polymer spin coat flow stress. In addition, the dry film PR island 24 can provide an echelon/straight island 24 which leaves space for PR strip chemicals to easily react, 25-30 um with 5-10 um thicker than in case of 20 um polymer coating will also help. The dry film patterning will also produce PR islands 24 with substantially vertical sidewalls which are used to straight via sidewalls.

Figure 6:
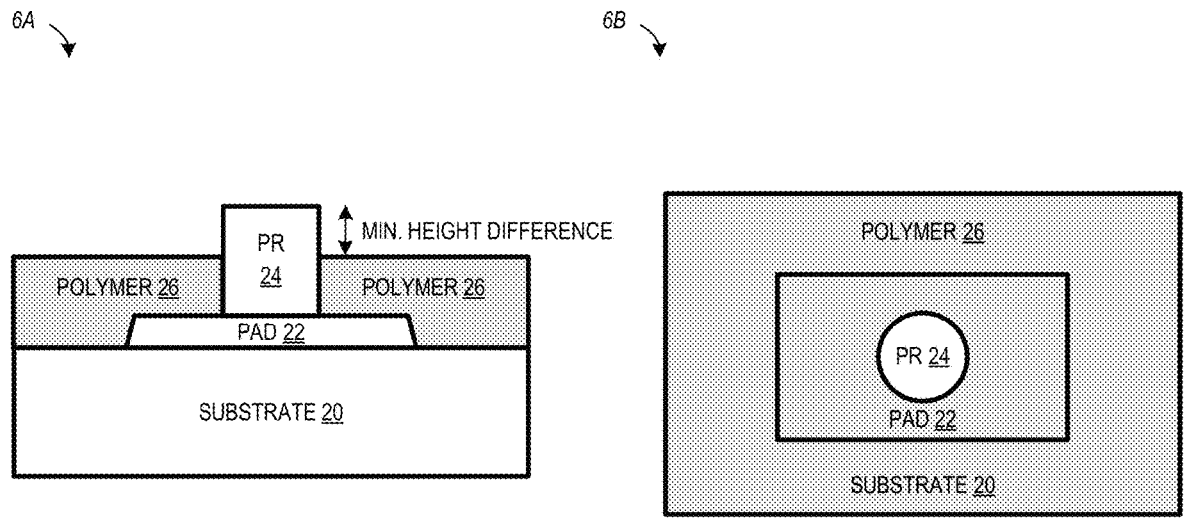
FIG. 6 illustrates processing subsequent to FIG. 5 after forming a dielectric polymer layer over the integrated circuit substrate and to a height below the patterned photoresist island in accordance with selected embodiments of the present disclosure.

Referring now to FIG. 6, there is illustrated a cross-section view 6A and plan view 6B of the semiconductor structure subsequent to FIG. 5 after forming a dielectric polymer layer 26 over the integrated circuit substrate 20 and die pad 22 to a height below the patterned photoresist island 24. With the dielectric polymer layer 26 may be formed with any suitable technique, in selected embodiments, a soft bake polymer coating of polyimide and/or polybenzoxazoles (PBO) is deposited over the wafer to a predetermined thickness or height that is controlled so that the PR island 24 protrudes or extends above the dielectric polymer layer 26. For example, a spin coating technique may be used to coat the wafer with the dielectric polymer layer 26 to a uniform thickness which completely covers the die pad 22 and which leaves a minimum height difference or stand-off between the top of the dielectric polymer layer 26 and the top of the PR island 24. To ensure uniform coating of the dielectric polymer 26 and avoid incomplete coating caused by the PR island 24 splitting the coating flow, the polymer coating recipe should use a longer spreading time under slow speeds. In addition, a pre-wet treatment may be applied to enhance polymer wetting capability, thereby ensuring that the dielectric polymer coating closely surrounds the PR island 24.

Though not shown, it is possible that the polymer deposition process may leave a thin polymer cover layer on the top and vertical sidewalls of the PR island 24 extending above the dielectric polymer 26, thereby potentially limiting the ability to remove the PR island 24 with a subsequent PR strip process. This can be addressed at least in part by using a negative tone photoresist dry film used to form the PR island 24. In addition, polymer cover layers can be prevented from being formed by controlling the minimum height difference between the PR island 24 and the dielectric polymer layer 26 to create a polymer un-cover space. The minimum height difference is also helpful to address situations where the subsequently applied PR strip process causes the dielectric polymer layer 26 to swell or expand, thereby covering the PR island 24. Another technique for addressing polymer cover layers is to apply a post polymer coating extra de-scum removal process to remove polymer cover layers from the sidewall of the PR island.

Figure 7:
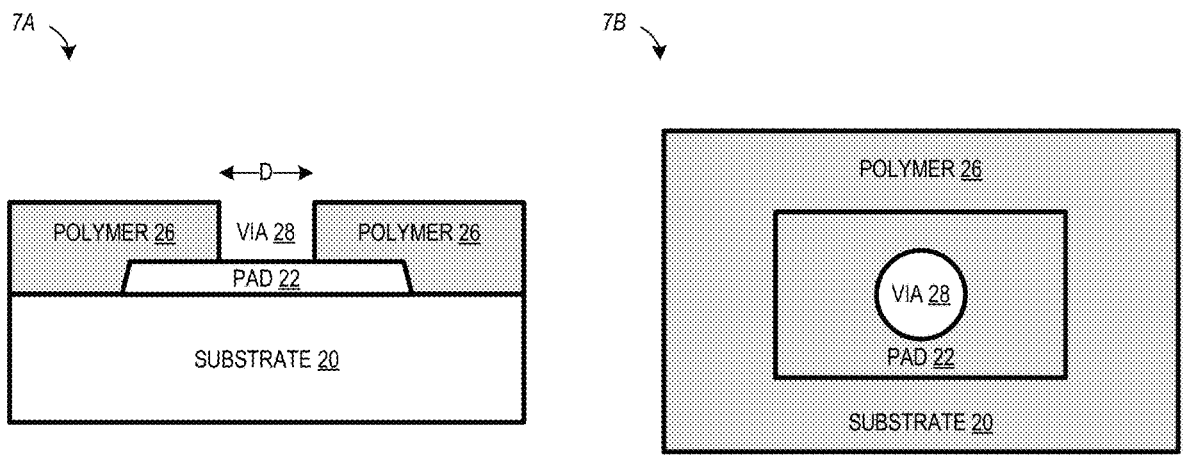
FIG. 7 illustrates processing subsequent to FIG. 6 after removing the patterned photoresist island to form an extremely small via opening over the die pad in accordance with selected embodiments of the present disclosure.

Referring now to FIG. 7, there is illustrated a cross-section view 7A and plan view 7B of the semiconductor structure subsequent to FIG. 6 after removing the patterned photoresist island 24 to form an extremely small via opening 28 over the die pad 22. In the depicted processing stage, the patterned PR island 24 has been removed using any suitable PR stripping process that is designed to selectively remove photoresist materials without etching or removing the dielectric polymer 26. If desired, an after strip inspection (ASI) may be performed to detect any defects from the PR stripping process.

In the via opening 28, one or more plating and/or conductive layers may be formed to create an electrically conductive contact to the underlying contact area/die pad 22. As will be appreciated, the via openings 28 may be formed at any level of the carrier substrate, and not just for creating contacts at the die pad level. For example, as the carrier substrate is built up on the wafer/die, via openings in each succeeding dielectric polymer layer may be formed by using photoresist lithography techniques to construct the PR islands which define the targeted, extremely small via openings having width dimensions below 5 um that may be filed with plating/conductive layers to form conductive contacts, thereby allowing reduction in pitch spacing, improvements in via resolution, and increases in interconnection densities. As disclosed herein, the photoresist techniques used to form the PR island 24 enable the via opening width parameter to be controlled so that is significantly smaller than the width parameter of the via openings formed using photolithography techniques to etch the dielectric polymer layers.

Figure 8:
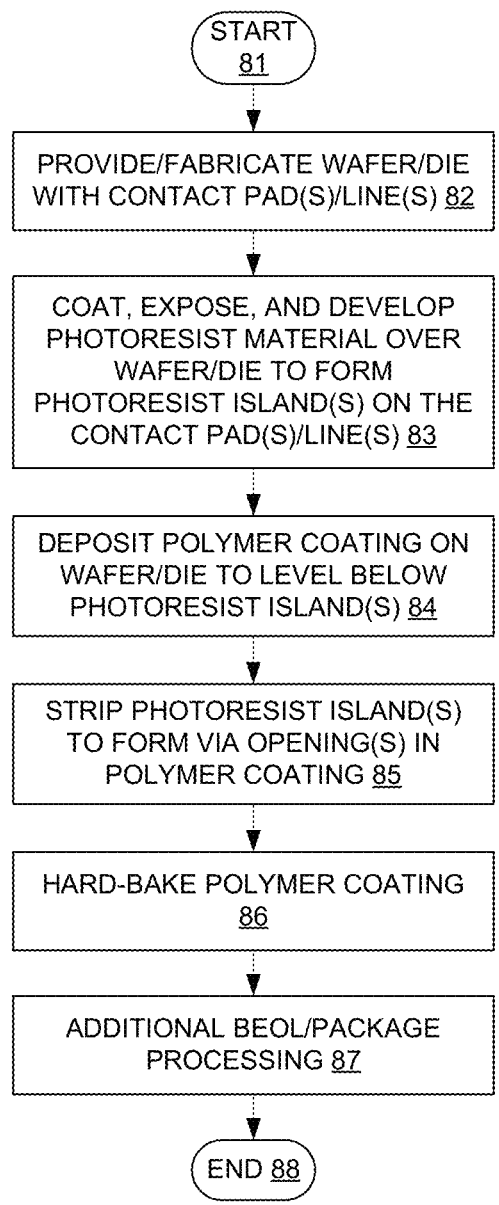
FIG. 8 is a simplified flow chart for fabricating an integrated circuit package via openings in accordance with selected embodiments of the present disclosure.

To further illustrate selected embodiments of the present invention, reference is now made to FIG. 8 which is a simplified flow chart 80 illustrating an example fabrication method for using photoresist islands to fabricate extremely small via openings in dielectric polymer layers of a carrier substrate. In describing the fabrication methodology, the description is intended merely to facilitate understanding of various exemplary embodiments and not by way of limitation. Unless otherwise indicated, the steps may be provided in any desired order. Since the steps illustrated in FIG. 8 and described below are provided by way of example only, it will be appreciated that the sequence of illustrated steps may be modified, reduced or augmented in keeping with the alternative embodiments of the disclosure so that the method may include additional steps, omit certain steps, substitute or alter certain steps, or perform certain steps in an order different than that illustrated in FIG. 8. Thus, it will be appreciated that the methodology of the present invention may be thought of as performing the identified sequence of steps in the order depicted, though the steps may also be performed in parallel, in a different order, or as independent operations that are combined.

Once the methodology starts (step 81), a wafer structure and/or die is provided or fabricated at step 82. As formed, the wafer structure/die includes one or more contact pads and/or lines (e.g., a redistribution line) located on a top and/or bottom surface of the wafer structure/die. For example, one or more integrated circuit die may be affixed to a carrier substrate with a plurality of die pads formed on a backside or frontside of the wafer structure/die which may be formed as a semiconductor substrate layer, a passivation layer or an interconnect layer.

At step 83, patterned photoresist islands are formed on the contact pad(s)/line(s) by coating, exposing, and developing a layer of photoresist material over the wafer structure/die. As formed, the patterned photoresist island(s) have a predetermined shape, target width, and minimum height such that the photoresist island(s) have vertical sidewalls that define a critical width dimension (e.g., no more than 5 um) and a critical height dimension (e.g., at least 5 um) which is selected to be larger than a thickness dimension of a subsequently formed polymer coating layer. While any desired photoresist pattern process may be used, an example process may include a PR coating step which forms a photoresist layer by coating the wafer structure with a light-absorbing polymeric material, such as a suitable lithography resist from Rohm & Haas called UV-60. In addition or in the alternative, the photoresist layer may be formed by a spin coating process on the wafer structure/die. In selected embodiments, the photoresist layer to be formed to a specified thickness that is at least 5 um thicker than the polymer coating thickness. For example, if the polymer coating thickness is 10 um, then the photoresist layer thickness would be approximately 15 um. Of course, other thicknesses may be used, depending on the particular application. After coating the wafer structure with the photoresist layer, the photoresist coating layer may be baked at a temperature preferably in the range of 90 to 140° C. Subsequently, the photoresist layer is exposed to an imaging radiation through a photomask using any suitable lithography equipment. For example, when implemented with frond-end (fab) assembly, the advanced exposure EUV equipment can approach 2.4 nm lithography PR instead of IMD (Inter Metal Dielectric) opening. And with back-end (packaging) assembly implementations, either stepper or laser direct image (LDI) exposure can only approach um level lithography. By selectively exposing the photoresist layer to a source of actinic radiation, the properties of the radiated photoresist layer are altered so that a development process may be applied to form a patterned photoresist island. To this end, the wafer structure may be submerged in a suitable photoresist develop solution to remove the exposed photoresist layer, thereby forming the patterned photoresist islands. To remove the radiated photoresist layer, any desired developer solution or chemistry can be applied, such as the metal-ion-free develop chemistry (e.g., TMAH) provided by the Shipley Company under the name of CD26. If desired, an after-develop-inspection (ADI) step may be performed to detect any defects from the photoresist development process.

At step 84, a polymer coating is deposited on the wafer structure/die to a predetermined maximum thickness that is at least 5 um shorter than the critical height dimension of the previously-formed photoresist islands so that the polymer coating layer surrounds but does not cover the patterned photoresist islands. While any suitable polymer deposition process may be used, an example process may include a polymer coating step which forms spin-coats the wafer structure with a dielectric polymer layer material, such as a soft bake polymer coating of polyimide and/or polybenzoxazoles (PBO). As formed, the polymer coating is deposited over the wafer to a predetermined thickness or height that is controlled so that the photoresist islands protrude or extend above the polymer coating layer. Having previously formed the photoresist island(s) to define targe via opening areas in the polymer coating layer, there is no requirement for applying photolithography processing steps to expose and develop the polymer layer to create via openings, thereby not only eliminating the additional processing costs, but also avoiding the requirement of balancing the numerous control parameters in coating, exposing, developing and soft/hard baking the polymer coating to achieve a targeted sidewall profile in any etched via openings.

At step 85, the patterned photoresist islands are removed or stripped from the wafer structure/die to form via openings in the polymer coating layer where the photoresist islands were previously located. While any suitable resist strip process may be used, an example process may remove the exposed or protruding patterned photoresist islands by using a plasma-based ash process and/or wet etch chemistry which selectively removes the patterned photoresist islands without etching the polymer coating layer. In cases where there are any covering polymer coating layers on the top or sidewall surfaces of the patterned photoresist islands extending above the polymer coating layer, an etch process may be applied to clear the covering polymer coating layers before applying the photoresist strip process. If desired, an after-strip-inspection (ASI) step may be performed to detect any defects from the PR stripping process. By stripping the patterned photoresist islands from the polymer coating layer, the space previously filled by the patterned photoresist islands now forms via openings having a profile and shape corresponding to the portion of the patterned photoresist islands that were surrounded by the polymer coating layers.

At step 86, the polymer coating layer is hard-baked and/or cured to give the polymer coating layer the mechanical properties that are needed for subsequent backend processing. In selected embodiments, there is no UV cure process required to polymerize the polymer coating layer, and it is sufficient to apply a hard-bake. In addition, there are no polymer residue concerns that would otherwise arise with conventional lithography-based approaches for etching via openings in the polymer coating layer, so there is no need to perform a post-cure de-scum process.

At step 87, one or more additional backend of line (BEOL) and/or package processing steps are performed on the wafer structure/die. In selected embodiments, the processing at step 87 includes forming conductive vias and/or lines in the via openings. The conductive vias/lines may be formed with one or more electroplating layers, diffusion barrier layers, adhesion layers, conductive layers, and the like. In selected embodiments, the conductive liners may be formed of titanium, titanium nitride, tantalum, tantalum nitride, or other alternatives. On the conductive liner layers, the conductive layers may be formed with any suitable conductive material, such as copper, a copper alloy, silver, gold, tungsten, aluminum, or the like. In selected embodiments, the conductive vias/lines may be formed by blanket depositing a liner in the via opening, followed by depositing a thin seed layer of copper or copper alloy over the liner, and filling the rest of via openings with metallic material, such as by using electro-plating, electro-less plating, deposition, or the like. A planarization process, such as chemical mechanical planarization (CMP) may then be performed to level the surface of conductive lines and to remove excess conductive materials from the top surface of dielectric layer. Subsequently, a masked etch process may be applied to pattern the conductive vias/lines. In subsequent steps, an interlayer dielectric (ILD) layer may be formed by depositing one or more dielectric layers over the patterned conductive vias/lines, and the process is then repeated to form additional via openings in the ILD layer. After completion of the backend of line (BEOL) and/or package processing steps, the fabrication method ends at step 88.

As disclosed herein, extremely small via openings can be fabricated as part of the integrated circuit die packaging process by forming photoresist islands on intended contact areas (e.g., die pads or redistribution lines), depositing one or more dielectric packaging layers over the integrated circuit die to surround the photoresist islands, and then removing the photoresist islands to form via openings in the dielectric packaging layer(s) which expose the intended contact areas. The resulting control provided over the shape and reduced width dimensions of the via openings may be beneficially applied in a number of packaging technologies which use bumping technologies, including but not limited to fan-out Wafer-Level Packaging (FOWLP), Wafer Level Chip Scale Packaging (WLCSP), Flip Chip BGA (FcBGA), Flip Chip Scale Packaging (FcCSP), Flip-Chip Quad Flat No lead (FcQFN), and the like.

Figure 9:
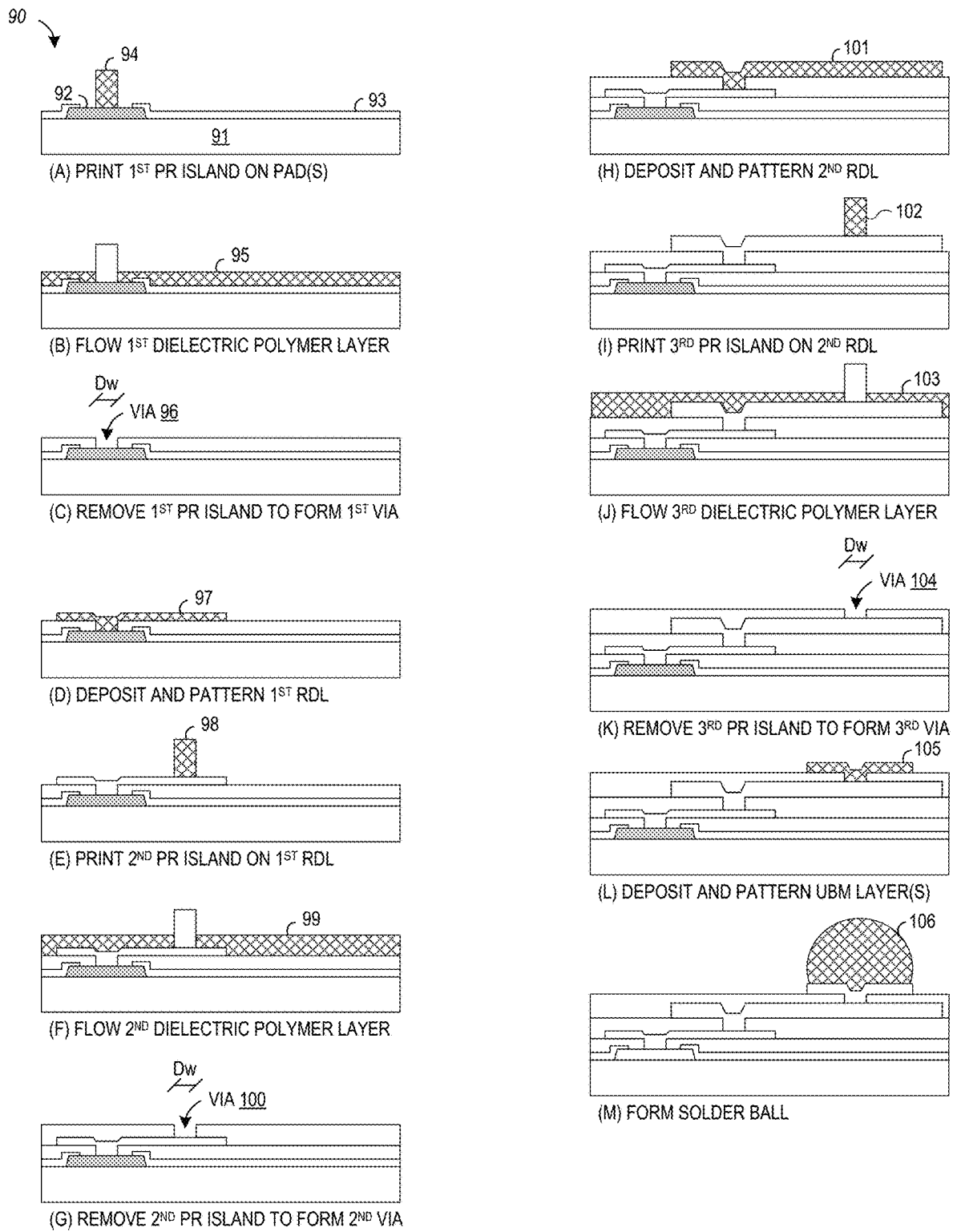
FIG. 9 illustrates in cross-sectional form a WLP bumping fabrication sequence in which photoresist islands are used to form via openings for RDL and solder ball contacts in accordance with selected embodiments of the present disclosure.

For an improved understanding of selected embodiments of the present disclosure, reference is now made to FIG. 9 which illustrates in cross-sectional form a sequence of WLP bumping fabrication stages (A)-(M) in which photoresist islands are used to form via openings at multiple levels for RDL and external conductors. In the ensuing description of the fabrication stages, newly added features at each stage are identified with cross-hatched shading and additive reference numbers without retaining the previously listed reference numbers. While the disclosed sequence of WLP bumping fabrication stages are shown as forming a WLP fan-in/out package having two levels of redistribution lines (RDL) connecting a die pad to and a solder ball external conductor, it will be appreciated that addition or fewer RDLs levels can be formed and/or that other external conductors can be used, such as copper pillars or bumps.

In a first stage (A) of the disclosed embodiment, an integrated circuit substrate 91 is provided with one or more die pads 92 formed on either side of the IC substrate which may be a silicon substrate layer on a backside or frontside of the IC die, or may be a passivation layer or interconnect layer formed on a backside or frontside of the IC die. In addition, a patterned passivation layer 93 is formed over the substrate 91 and die pad 92 to leave an exposed contact region of the die pad 92. On the exposed contact region, a first patterned photoresist (PR) island 94 is formed by exposing and developing a thin photoresist coating layer using any suitable photoresist lithography sequence. As formed, the first PR island 94 has a defined shape with vertical sidewalls, a critical width dimension (e.g., <5 um), and minimum specified height dimension.

At a second stage (B), a first dielectric polymer layer 95 is formed over the substrate, such as by spin-coating a soft bake polymer coating of polyimide and/or polybenzoxazoles (PBO) to a predetermined thickness or height that is controlled to be lower than the top of the first PR island 94. The first dielectric polymer layer 95 is formed to surround the first PR island which protrudes or extends above the dielectric polymer layer 95.

At a third stage (C), the patterned PR island 94 is removed to form the first via opening 96 which exposes the underlying die pad 92. For example, a resist strip etch chemistry may be applied to remove the first PR island 94 without etching the first dielectric polymer layer 95, leaving the first via opening 96. By using the first PR island 94 to define the first via opening 96 in the first dielectric polymer layer 95, the resulting first via opening 96 has an extremely small width dimension Dw (e.g., <5 um) and vertical sidewalls, thereby allowing reduction in pitch spacing, improvements in via resolution, and increases in interconnection densities.

At fourth stage (D), a first redistribution line (RDL) 97 is formed with one or more conductive layers to fill the first via opening 96 and contact the underlying die pad 92. For example, the first RDL 97 may be formed by sputter depositing a seed layer over the substrate, forming a patterned photoresist mask with an RDL opening which overlaps with the first via opening 96, electroplating one or more conformal conductive layers in the RDL opening, stripping the patterned photoresist mask, and then etching the exposed seed layer from the surface of the substrate 91 to define the first RDL 97 as a first level interconnect conductor. The depicted first RDL layer 97 is shown as conformally filling the via opening 96, though it will be appreciated that a planarizing process (e.g., CMP) may be applied to planarize the first RDL layer 97.

As disclosed herein, the fabrication stages (A)-(D) may be repeated one or more additional times to create additional RDL layers if desired. For example, in a fifth stage (E), a second patterned photoresist (PR) island 98 may be formed on the first RDL 97 by coating the semiconductor structure with a thin photoresist coating that is exposed and developed to form the second PR island 98 with a defined shape which may include vertical sidewalls, a critical width dimension (e.g., <5 um), and minimum specified height dimension.

At a sixth stage (F), a second dielectric polymer layer 99 is formed over the semiconductor structure, such as by spin-coating or flowing a soft bake polymer coating to a predetermined thickness or height that is controlled to be lower than the top of the second PR island 98 so that the second dielectric polymer layer 99 surrounds the second PR island 98 which protrudes or extends above the second dielectric polymer layer 99.

At a seventh stage (G), the second patterned PR island 98 is removed to form the second via opening 100 which exposes the underlying first RDL 97, such as by applying a resist strip etch chemistry to remove the second PR island 98 without etching the second dielectric polymer layer 99, leaving the second via opening 100. By using the second PR island 98 to define the second via opening 100 in the second dielectric polymer layer 99, the resulting second via opening 100 has an extremely small width dimension Dw (e.g., <5 um) and vertical sidewalls, thereby allowing reduction in pitch spacing, improvements in via resolution, and increases in interconnection densities.

At an eighth stage (H), a second RDL 101 is formed with one or more conductive layers to fill the second via opening 100 and contact the underlying first RDL 97. For example, the second RDL 101 may be formed by sputter depositing a seed layer over the semiconductor structure, forming a patterned photoresist mask with a second RDL opening which overlaps with the second via opening 100, electroplating one or more conformal conductive layers in the second RDL opening, stripping the patterned photoresist mask, and then etching the exposed seed layer from the surface of the semiconductor structure to define the second RDL 101 as a second level interconnect conductor. If desired, the second RDL layer 101 may be planarized, such as by applying a CHIP process.

At some point, an external conductor may be formed in electrical contact with the RDLs 97, 101 and die pad 92. For example, at a ninth stage (I), a third patterned photoresist (PR) island 102 may be formed on the second RDL 101 by coating the semiconductor structure with a thin photoresist coating that is exposed and developed to form the third PR island 102 with a defined shape which may include vertical sidewalls, a critical width dimension (e.g., <5 um), and minimum specified height dimension.

At a tenth stage (J), a third dielectric polymer layer 103 is formed over the semiconductor structure, such as by spin-coating or flowing a soft bake polymer coating to a predetermined thickness or height that is controlled to be lower than the top of the third PR island 102 so that the third dielectric polymer layer 103 surrounds the protruding third PR island 102.

At an eleventh stage (K), the third patterned PR island 102 is removed to form the third via opening 104 which exposes the underlying second RDL 101, such as by applying a resist strip etch chemistry to remove the third PR island 102 without etching the third dielectric polymer layer 103, leaving the third via opening 104. By using the third PR island 102 to define the third via opening 104 in the third dielectric polymer layer 103, the resulting third via opening 104 has an extremely small width dimension Dw (e.g., <5 um) and vertical sidewalls, thereby allowing reduction in pitch spacing, improvements in via resolution, and increases in interconnection densities.

At a twelfth stage (L), an under bump metallization (UBM) layer 105 is formed with one or more conductive layers to fill the third via opening 104 and contact the underlying second RDL 101. For example, the UBM layer 105 may be formed by sputter depositing a seed layer over the semiconductor structure, forming a patterned photoresist mask with a third RDL opening which overlaps with the third via opening 104, electroplating one or more conformal conductive layers in the third RDL opening, stripping the patterned photoresist mask, and then etching the exposed seed layer from the surface of the semiconductor structure to define the UBM layer 105.

At a thirteenth stage (M), a solder ball connector 106 is formed using any suitable bump flow. For example, the solder ball connector 106 may be formed by forming a patterned photoresist mask with a contact opening which exposes the underlying UBM layer 105, electroplating a solder layer in the contact opening, stripping the patterned photoresist mask, and then reflowing the solder layer to define the solder ball connector 106. As will be appreciated, there are alternatives to forming a solder ball connector 106, such as forming copper pillar structures on the UBM layer 105.

By now it should be appreciated that there has been provided a method for making a package assembly, such as a fan-out Wafer-Level Packaging (FOWLP) device, by forming via openings in a semiconductor device. Under the method, a semiconductor device is provided that has one or more conductive patterns disposed on a first surface of the semiconductor device. In selected embodiments, the conductive patterns are formed with patterned conductive layers, such as die pads or redistribution lines. The disclosed method also includes forming, on each conductive pattern, a photoresist island having a first predetermined shape defined by a minimum height dimension and a first critical width dimension which may, in some embodiments, be less than or equal to 5 um. In selected embodiments, the photoresist islands may be formed by depositing a resist layer over the semiconductor device and one or more conductive patterns, selectively exposing the resist layer to a source of radiation, and then applying a develop solution to selectively remove one or more portions of the resist layer, thereby forming photoresist islands on the conductive patterns. In addition, the disclosed method includes forming a dielectric polymer layer on the semiconductor device to surround but not cover each photoresist island. In selected embodiments, the dielectric polymer layer may be formed by spin-coating a layer of polyimide and/or polybenzoxazoles over the wafer to a predetermined thickness so that the photoresist island protrudes above the dielectric polymer layer. The disclosed method also includes selectively removing each photoresist island from the one or more conductive patterns to form one or more via openings to expose the one or more conductive patterns, each via opening having a second predetermined shape which matches at least part of the first predetermined shape of the photoresist island. In selected embodiments, the photoresist islands are selectively removed by stripping each photoresist island from the one or more conductive patterns to form one or more via openings. As formed, the predetermined shape of each via opening includes vertical sidewalls which are defined by the predetermined shape of the photoresist island. The disclosed method may also include depositing one or more conductive layers in the via opening to form a via contact. As disclosed, the package assembly may package the semiconductor device as a fan-out Wafer-Level Packaging (FOWLP) device, a Wafer Level Chip Scale Packaging (WLCSP) device, a Flip Chip BGA (FcBGA) device, a Flip Chip Scale Packaging (FcCSP) device, or a Flip-Chip Quad Flat No lead (FcQFN) device.

In another form, there is provided a method for fabricating a via structure on a semiconductor device. In the disclosed methodology, a semiconductor device is provided which has a first surface on which a patterned conductive layer is formed. In selected embodiments, the semiconductor device is a fan-out Wafer-Level Packaging (FOWLP) device, a Wafer Level Chip Scale Packaging (WLCSP) device, a Flip Chip BGA (FcBGA) device, a Flip Chip Scale Packaging (FcCSP) device, or a Flip-Chip Quad Flat No lead (FcQFN) device. In other embodiments, the patterned conductive layer is selected from a group consisting of a die pad or redistribution line. On the first surface of the semiconductor device, a patterned photoresist island is selectively formed which has a minimum height and vertical sidewalls on the patterned conductive layer. In selected embodiments, the patterned photoresist island is selectively formed by coating, exposing and developing a photoresist layer on the first surface of the semiconductor device to define the patterned photoresist island. In other embodiments, the patterned photoresist island is selectively formed by forming a resist layer on the first surface of the semiconductor device; selectively exposing the resist layer to a source of radiation; and applying a develop solution to selectively remove one or more portions of the resist layer, thereby forming the patterned photoresist island on the patterned conductive layer. In selected embodiments, the patterned photoresist island has a first critical width dimension less than or equal to 5 um. Subsequently, the first surface of the semiconductor device is coated with a soft-bake polymer layer to surround the patterned photoresist island to a height below the minimum height of the patterned photoresist island. In selected embodiments, the first surface of the semiconductor device is coated by spin-coating a soft-bake polymer layer of polyimide and/or polybenzoxazoles over the first surface of the semiconductor device to a predetermined thickness so that the patterned photoresist island protrudes above the soft-bake polymer layer. After stripping the patterned photoresist island from the soft-bake polymer layer, a via opening is formed which has vertical sidewalls that expose the patterned conductive layer. Subsequently, a hard baking step is applied to the soft-bake polymer layer with the via opening formed to expose the patterned conductive layer. In the via opening, one or more conductive layers is deposited to form a via structure. In selected embodiments, the conductive layers are deposited in the via opening by sputter depositing a seed layer on the vertical sidewalls and exposed patterned conductive layer in the via opening, and electroplating one or more conformal conductive layers on the seed layer to fill the via opening. In such embodiments, the selectively etching of the one or more conformal conductive layers forms a redistribution layer on the first surface of the semiconductor device.

In yet another form, there is provided a semiconductor wafer structure and method for making same. As disclosed, the semiconductor wafer structure device includes a semiconductor substrate having a first surface on which is formed a patterned plurality of conductive layers. The semiconductor wafer structure also includes a patterned photoresist island formed on each of the patterned plurality of conductive layers, each patterned photoresist island having a minimum height, a first critical width dimension, and vertical sidewalls. In addition, the semiconductor wafer structure includes a soft-bake polymer coating layer formed the first surface of the semiconductor substrate to surround each patterned photoresist island to a height below the minimum height. In selected embodiments, the first critical width dimension for each of the patterned photoresist islands is less than or equal to 5 um.

Although the described exemplary embodiments disclosed herein are directed to various packaging assemblies and methods for making same, the present invention is not necessarily limited to the example embodiments which illustrate inventive aspects of the present invention that are applicable to a wide variety of packaging processes and/or devices. For example, other integrated circuit die attachment and connection configurations may be used, such as, for example, packaging an integrated circuit die using Wafer Level Chip Scale Packaging (WLCSP), Flip Chip BGA (FcBGA), Flip Chip Scale Packaging (FcCSP), Flip-Chip Quad Flat No lead (FcQFN), etc. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method, comprising:
   providing a semiconductor device comprising one or more conductive patterns disposed on a first surface of the semiconductor device;
   forming, on each conductive pattern, a photoresist island having a first predetermined shape defined by a first critical width dimension and a minimum height dimension;
   forming a dielectric polymer layer on the semiconductor device to surround but not cover each photoresist island;
   selectively removing each photoresist island from the one or more conductive patterns to form one or more via openings to expose the one or more conductive patterns, each via opening having a second predetermined shape which matches at least part of the first predetermined shape of the photoresist island.

2. The method of claim 1, where the one or more conductive patterns comprise patterned conductive layers selected from a group consisting of die pads or redistribution lines.

3. The method of claim 1, where forming the photoresist island comprises:
   forming a resist layer over the semiconductor device and one or more conductive patterns;
   selectively exposing the resist layer to a source of radiation; and
   applying a develop solution to selectively remove one or more portions of the resist layer, thereby forming a photoresist island on each conductive pattern.

4. The method of claim 1, where the predetermined shape of each via opening comprises vertical sidewalls which are defined by the predetermined shape of the photoresist island.

5. The method of claim 1, where forming the dielectric polymer layer comprises spin-coating a dielectric polymer layer of polyimide and/or polybenzoxazoles over the semiconductor device to a predetermined thickness so that the photoresist island protrudes above the dielectric polymer layer.

6. The method of claim 1, where selectively removing each photoresist island comprises stripping each photoresist island from the one or more conductive patterns to form one or more via openings.

7. The method of claim 1, further comprising depositing one or more conductive layers in the via opening to form a via contact.

8. The method of claim 1, where the semiconductor device comprises a fan-out Wafer-Level Packaging (FOWLP) device, a Wafer Level Chip Scale Packaging (WLCSP) device, a Flip Chip BGA (FcBGA) device, a Flip Chip Scale Packaging (FcCSP) device, or a Flip-Chip Quad Flat No lead (FcQFN) device.

9. The method of claim 1, where the first critical width dimension is less than or equal to 5 um.

10. A method for fabricating a via structure on a semiconductor device, comprising:
providing a semiconductor device having a first surface on which a patterned conductive layer is formed;
selectively forming, on the first surface of the semiconductor device, a patterned photoresist island having a minimum height and vertical sidewalls on the patterned conductive layer;
coating the first surface of the semiconductor device with a soft-bake polymer layer to surround the patterned photoresist island to a height below the minimum height of the patterned photoresist island;
stripping the patterned photoresist island from the soft-bake polymer layer to form a via opening which has vertical sidewalls that expose the patterned conductive layer;
hard baking the soft-bake polymer layer with the via opening formed to expose the patterned conductive layer; and
depositing one or more conductive layers in the via opening to form a via structure.

11. The method of claim 10, where providing the semiconductor device comprises a providing a fan-out Wafer-Level Packaging (FOWLP) device, a Wafer Level Chip Scale Packaging (WLCSP) device, a Flip Chip BGA (FcBGA) device, a Flip Chip Scale Packaging (FcCSP) device, or a Flip-Chip Quad Flat No lead (FcQFN) device.

12. The method of claim 10, where selectively forming the patterned photoresist island comprises coating, exposing and developing a photoresist layer on the first surface of the semiconductor device to define the patterned photoresist island.

13. The method of claim 12, where selectively forming the patterned photoresist island comprises:
forming a resist layer on the first surface of the semiconductor device;
selectively exposing the resist layer to a source of radiation; and
applying a develop solution to selectively remove one or more portions of the resist layer, thereby forming the patterned photoresist island on the patterned conductive layer.

14. The method of claim 12, where coating the first surface of the semiconductor device comprises spin-coating a soft-bake polymer layer of polyimide and/or polybenzoxazoles over the first surface of the semiconductor device to a predetermined thickness so that the patterned photoresist island protrudes above the soft-bake polymer layer.

15. The method of claim 10, where depositing one or more conductive layers in the via opening comprises:
sputter depositing a seed layer on the vertical sidewalls and exposed patterned conductive layer in the via opening; and
electroplating one or more conformal conductive layers on the seed layer to fill the via opening.

16. The method of claim 15, further comprising selectively etching the one or more conformal conductive layers to form a redistribution layer on the first surface of the semiconductor device.

17. The method of claim 10, where the patterned photoresist island has a first critical width dimension less than or equal to 5 um.

18. The method of claim 10, where the patterned conductive layer is selected from a group consisting of a die pad or redistribution line.

* * * * *